US007313378B2

(12) United States Patent
Terry (10) Patent No.: US 7,313,378 B2
(45) Date of Patent: Dec. 25, 2007

(54) TRACKING AUTOMATIC GAIN CONTROL

(75) Inventor: John David Terry, Santa Rosa, CA (US)

(73) Assignee: Starkey Laboratories, Inc., Eden Prairie, MN (US)

( * ) Notice: Subject to any disclaimer, the term of this patent is extended or adjusted under 35 U.S.C. 154(b) by 387 days.

(21) Appl. No.: 10/723,843

(22) Filed: Nov. 26, 2003

(65) Prior Publication Data

US 2005/0111401 A1    May 26, 2005

(51) Int. Cl.
H04B 1/06 (2006.01)
H04B 7/00 (2006.01)

(52) U.S. Cl. ................ 455/254; 455/234.1; 455/250.1

(58) Field of Classification Search ............ 455/234.1, 455/234.2, 239.1, 245.1, 246.1, 250.1, 254–260, 455/264, 263
See application file for complete search history.

(56) References Cited

U.S. PATENT DOCUMENTS

| 6,563,891 | B1 * | 5/2003 | Eriksson et al. | ............ 375/345 |
| 2002/0048267 | A1 * | 4/2002 | Jacques et al. | ............ 370/347 |
| 2003/0026363 | A1 | 2/2003 | Stoter et al. | |
| 2003/0162518 | A1 * | 8/2003 | Baldwin et al. | ......... 455/253.2 |
| 2004/0234089 | A1 * | 11/2004 | Rembrand et al. | .......... 381/312 |
| 2005/0130687 | A1 * | 6/2005 | Filipovic et al. | ............ 455/522 |

OTHER PUBLICATIONS

"International Search Report for corresponding PCT Application No. PCT/US2004/039626", (Apr. 7, 2005), 5 pgs.

Drenski, T. , et al., "TA 9.3 A BiCMOS 300ns Attack-Time AGC Amplifier With Peak-Detect and Hold Feature for High-Speed Wireless ATM Systems", *1999 IEEE International Solid-State Circuits Conference*, (1999), 10 pgs.

Duque-Carrillo, J.F., et al., "VERDI: An Acoustically Programmable and Adjustable CMOS Mixed-Mode Signal Processor For Hearing Aid Applications", *IEEE Journal of Solid-State Circuits, IEEE Inc.*, (May 1996), 634-644.

M'Closkey, R. T., et al., "Analysis of a Microsensor Automatic Gain Control Loop", *Proceedings of the American Control Conference*, (1999), 3307-3311.

\* cited by examiner

*Primary Examiner*—Edward F. Urban
*Assistant Examiner*—Christian A. Hannon
(74) *Attorney, Agent, or Firm*—Schwegman, Lundberg & Woessner, P.A.

(57) ABSTRACT

An automatic gain control provides for enhanced acquisition and tracking of wireless signals. The wireless signals may include signals using electrostatic fields, magnetic fields, or electromagnetic fields. In an embodiment, wireless signals are provided as radio frequency signals. The automatic gain control design is intended to quickly acquire new incoming information in a wireless signal. A control unit regulates the automatic gain control to manage the acquisition and gain of the wireless signal based on a transmission protocol. The automatic gain control adjusts the gain for the wireless signal to a minimal level required for detection for a preprogrammed amount of time, at the same time minimizing unwanted background noise from interfering with the data packet. When the communication session is concluded, the automatic gain control can be released allowing increased sensitivity in preparation of the next transmission.

45 Claims, 3 Drawing Sheets

TRACKING AUTOMATIC GAIN CONTROL

FIELD OF THE INVENTION

This invention relates generally to automatic gain control, more particularly to automatic gain control for hearing aids.

BACKGROUND

Increasingly a wide variety of electronic devices utilize wireless communications. Many electronic devices that are traditionally intended for non-electromagnetic communication also include features for wireless communication with other devices and control devices. Increased features for device application and increased features related to wireless communication in such electronic devices have created additional technical challenges.

One of the technical challenges is associated with providing the application features and the communication features with a design that uses minimal space and power consumption that is attractive for consumer use. Additionally, robust designs are needed to ensure reliable communications and low failure rates.

Thus, there is a need in the art for wireless communication electronics that provide smaller space and power consumption. The electronics should include robust circuits that provide reliable communications with elegant designs providing low cost construction and manufacturing overhead.

SUMMARY OF THE INVENTION

Upon reading and understanding the present disclosure it is recognized that the inventive subject matter described herein satisfies the foregoing needs in the art and several other needs in the art not expressly noted herein. The following summary is provided to give the reader a brief summary that is not intended to be exhaustive or limiting and the scope of the invention is provided by the attached claims and the equivalents thereof.

An automatic gain control (AGC) provides for quickly acquiring incoming information in a wireless signal, where a control unit regulates the automatic gain control to manage the acquisition and gain of the wireless signal based on a transmission protocol. A wireless signal may include signals using electrostatic fields, magnetic fields, or electromagnetic fields. In an embodiment, wireless signals are provided as radio frequency (RF) signals. The automatic gain control adjusts the gain for the wireless signal to a minimal level required for detection for a preprogrammed amount of time, at the same time minimizing background noise and unwanted signals from electrostatic, magnetic, or electromagnetic fields interfering with data packets. When a communication session is concluded, the automatic gain control can be released allowing increased sensitivity in preparation of the next transmission. An automatic gain control as described herein provides for enhanced detection of wireless signals, including electrostatic field, magnetic field, and electromagnetic field detection. In an embodiment, an automatic gain control provides for enhanced detection of RF signals.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

A more complete understanding of the invention and its various features may be obtained from a consideration of the following detailed description, the appended claims, and the attached drawings.

DETAILED DESCRIPTION

In the following detailed description, reference is made to the accompanying drawings which form a part hereof and in which is shown by way of illustration embodiments in which the invention can be practiced. These embodiments are described in sufficient detail to enable those skilled in the art to practice and use the invention, and it is to be understood that other embodiments may be utilized and that electrical, logical, and structural changes may be made without departing from the spirit and scope of the present invention. The following detailed description is, therefore, not to be taken in a limiting sense and the scope of the present invention is defined by the appended claims and their equivalents.

Most radio frequency receivers can be configured into two basic groups. One group includes some type of linear or amplitude modulation (AM) scheme. The other group includes a constant envelope or a frequency modulation (FM) type limiter system. A FM type receiver system may use a control mechanism that depends on the saturation of the amplifiers, where signal extraction uses a phase comparison to the incoming signal. In an AM type receiver, a signal can be extracted in a number of different ways including extracting information from a carrier that is continuously being turned on and off. Such a modulation scheme is referred to as on/off keying (OOK). Other modulation schemes turn the carrier down, that is turn the level of the wireless signal down, but don't turn the carrier off completely. The wireless signal may include signals using electrostatic fields, magnetic fields, or electromagnetic fields. In an embodiment, wireless signals are provided as RF signals.

A receiver system has several characteristics that are attributable to detecting and obtaining a signal. For instance, an attack time is generally an initialization time for a detected signal to transition from a minimum level, such as a zero signal level, to a maximum signal level. Acquisition of an incoming signal includes attack and lock onto the incoming signal. Thus, for a receiver the acquisition time is at least as long as its attack time. For a receiver system with an automatic gain control, additional parameters include hold and release. A hold time for the automatic gain control is a period of time for which a gain for an incoming signal or a sensitivity for an incoming signal is maintained at a relatively constant level. Release for an automatic gain level is the release of a hold allowing a gain or sensitivity level to autonomously increase to a level dependent upon detecting an incoming signal.

Receivers can be realized in various configurations. For instance, a transceiver is a system or device that includes both a transmitter and a receiver. Thus, as discussed herein, embodiments for a receiver include embodiments for a transceiver and embodiments for a receiver system include embodiments for a transceiver and/or transceiver system.

In various embodiments of communication systems, a communication session uses wireless signals that are intermittent. The intermittent nature of wireless communications can have several different forms. For example, a communication session may use intermittent transmissions in which information is transferred in one time period, followed by no wireless transmissions for a period time, which is subsequently followed by a time period in which data is transferred. The automatic gain control for the receivers of such systems may autonomously increase the receiver signal gain in the absence of an incoming signal. Once a wireless signal is detected, the gain is adjusted, typically lowered, to properly track the detected signal. Associated with this process is a time for the AGC to properly acquire the wireless signal each time a new transmission is detected.

Another form of intermittent transmission in a communication session occurs for an OOK modulation scheme in which the minimum signal level defining a logic "0" is set at a zero signal level. Thus, detected wireless energy is recorded as a logic "1" and its absence as a logic "0". Acquisition of background noise in such a modulation scheme can then be an issue. Thus, during a logic "0" wireless noise energy can be interpreted as a logic "1". Further, when no wireless energy is present for a communication session, the receiver is excessively vulnerable to background wireless noise and/or unwanted signals causing false triggering. Each time the wireless carrier is turned off, the AGC can misinterpret the lack of a wireless signal as the loss of the signal for the communication session. To compensate the reaction time for the AGC can be slowed down such that the carrier off times for an OOK modulation are not taken as a loss of the session signal. This slow down in the AGC reaction time can have a detrimental effect to the acquisition time and tracking of the incoming signal.

In an embodiment, a receiver controls its automatic gain control with programmable acquisition, hold, and release parameters based on one or more transmission protocols to be used in a communication session using wireless signals. The wireless signal may include signals using electrostatic fields, magnetic fields, or electromagnetic fields. In an embodiment, wireless signals are provided as RF signals. Regulating the AGC using programmable acquisition, hold, and release parameters according to a transmission protocol allows the receiver to adapt to current conditions with respect to received wireless energy including background noise or unwanted signals. When a wireless transmission is concluded during a communication session in which the transmission protocol allows for intermittent wireless transmissions during the communication session, the AGC can be issued a hold command maintaining sensitivity in anticipation for the next wireless transmission in the communication session. If no desired wireless transmission is present or an end of transmission command is given to the AGC, the AGC can be allowed to increase its sensitivity in anticipation of a transmission for a new communication session. Other commands can be given to the AGC to increase its gain at the end of a wireless transmission in which the transmission protocol indicates that the next transmission in a communication session requires additional gain. Alternately, an end of transmission command can be used whenever a transmission protocol requires increased gain at the end of a wireless transmission of an on-going communication session. In various embodiments, sets of commands related to acquisition, hold, and release parameters in one or more transmission protocols can be used. The regulation of the AGC with respect to the transmission protocol used allows for enhanced signal acquisition and the suppression of electromagnetic interference.

Figure 1:
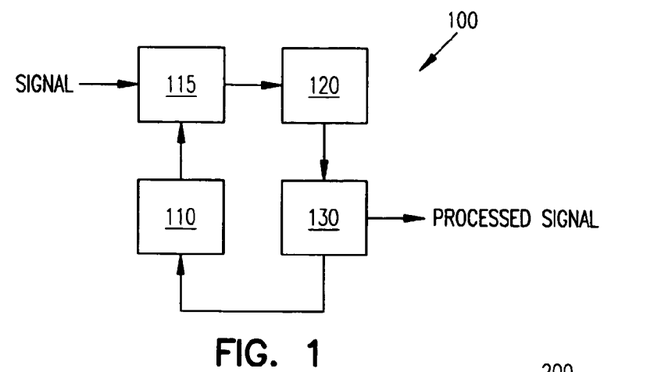
FIG. 1 shows a block diagram of an embodiment of a receiver having adaptive automatic gain control, in accordance with the teachings of the present invention.

FIG. 1 shows a block diagram of an embodiment of a receiver 100 having adaptive automatic gain control 110 to provide a processed signal. Receiver 100 is used in wireless communication sessions. In an embodiment, receiver 100 is used in a wireless communication session, where a wireless signal may include signals using electrostatic fields, magnetic fields, or electromagnetic fields. In an embodiment, wireless signals are provided as RF signals. In addition to automatic gain control 110, receiver 100 includes an amplifier section 115, a detector 120 and a control unit 130. Control unit 130 has programmable acquisition, hold, and release parameters to manage the acquisition and gain of the signal received at detector 120 based on a transmission protocol. In an embodiment, control unit 130 may have one or more sets of acquisition, hold, and release parameters, where each set is related to a different transmission protocol. A transmission protocol may use different sets of acquisition, hold, and release parameters for different transmission units related to anticipated incoming signals. In such a case control unit 130 may be programmed with sets of parameters for the different transmission units possible for each transmission protocol. In an embodiment, control unit 130 is a central processing unit (CPU). In an embodiment, control unit 130 is a computer. In an embodiment, control unit 130 that interprets the signal and determines acquisition, hold, and release times may be a digital or analog control device.

In an embodiment, control unit 130 is adapted to regulate the automatic gain control to adjust a gain to a minimal level for detection of a wireless signal for a predetermined amount of time according to the transmission protocol. Control unit 130 is adapted to issue a hold command to AGC 110 to maintain a sensitivity for a next wireless transmission in a communication session defined by a transmission protocol that uses intermittent transmitting to provide information. The hold command to AGC 110 may include a length of time to maintain the sensitivity. The hold command may also be issued to AGC 110 to use a predetermined gain level to minimize the acquisition time for a wireless signal for a new communication session. Control unit 130 regulates AGC 110 to increase a sensitivity when a communication session is ended. Control unit 130 also regulates AGC 110 to increase a sensitivity when a wireless signal is not present during a period in a communication session in which the transmission protocol indicates a wireless transmission is scheduled.

Control Unit 130 regulates AGC 110 such that AGC 110 adjusts the gain level in a rapid manner to acquire and track a wireless signal during data transmission in a communication session. AGC 110 is allowed to raise the gain when no wireless signal is present, and lower the gain to appropriate levels when a wireless signal is present.

To make these adjustments, track and hold circuits typically are programmed to establish a reasonable operating gain level, hold that gain level for a period of a determined period of time, and then release the gain level when the stimulus is gone. For example, a track and hold circuit can be adjusted with an acquisition time of several milliseconds, hold the gain either indefinitely or for a pre-set amount of time, drop the hold on the gain, and then go into an acquisition mode again.

In an embodiment, track and hold is adjusted dynamically related to the transmission protocol used with the arriving signal. In a transmission protocol in which the data signal includes information indicating that the data transmission will be off for a specified amount of time beginning at a specified time, the track and hold features of AGC 110 can be released at the specified time. Then, AGC 110 can enter a mode to receive a wireless transmission for the current communication session at the specified amount of time after the previous wireless transmission ended. In such a case, the AGC can be turned off, or the gain and/or sensitivity levels lowered or turned off, for the specified period, reducing power consumption in receiver 100. The off period of time may be defined to begin at the time at which the indication of an off period is provided. Various embodiments specifying these off and on times can be used depending on the protocol utilized.

Control unit 130 regulating AGC 110 according to a transmission protocol allows receiver 100 to be responsive to a single communication session, where the communication session may be with one of a number of possible source transmitters. For an identified source transmitter, a protocol for a single communication session allows signals from other sources to be ignored during the off periods of the identified source involved in a present communication session. AGC 110 turns back on, or increases its gain and/or sensitivity, at the end of the specified transmission off period of the communication session.

The adaptive nature of receiver 100 having a control unit 130 to regulate AGC 110 according to a protocol allows for efficient use of an OOK digital transmission scheme. Such a system allows for communication of information without requiring the use of data processing routines to account for transmission of multiple zeros or multiple ones. Though receiver 100 can be used with Manchester encoding, another type of gray code, or some means to limit the number of series of ones and series of zeros, receiver 100 does not require such coding schemes.

Figure 2:
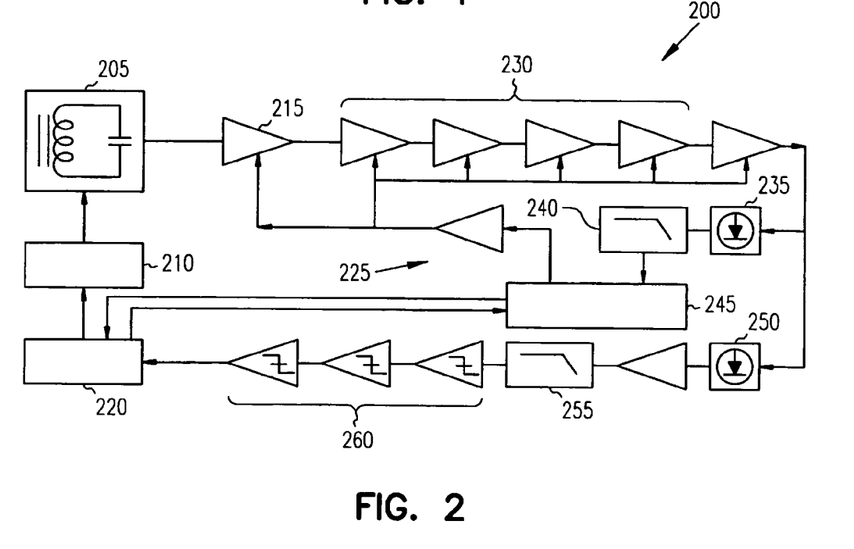
FIG. 2 is an embodiment of a receiver using an adaptive automatic gain control to adjust an incoming signal for proper demodulation, in accordance with the teachings of the present invention.

FIG. 2 is an embodiment of a receiver 200 using an adaptive automatic gain control to adjust an incoming wireless signal for proper demodulation. The wireless signal may include signals using electrostatic fields, magnetic fields, or electromagnetic fields. In an embodiment, wireless signals are provided as RF signals. Receiver 200 includes a resonant circuit 205, a transmit/receive switch 210, a low noise amplifier (LNA) 215, and a main control unit 220 to instruct AGC control section 245 and automatic gain control driver 225. Automatic gain control driver 225 interfaces with amplifiers 230 and LNA 215, and is controlled by AGC control section 245. ACG control section 245 interfaces with filter 240, detector 235, and the main control unit 220. Receiver 200 also includes a data detector 250 to provide the information being received. A signal from data detector 250 passes through a filter 255 before being processed by an analog to digital data converter 260.

Resonant circuit 205 picks up the magnetic field of AM signals. In various embodiments, a circuit picks up a wireless signal based on, or using, electric or electromagnetic fields. Resonant circuit 205 can be realized as a piece of ferrite with wire around it, or another configuration adapted to act as a small inductor. In an embodiment, resonant circuit 205 is configured to be compatible with integrated circuit technology. Additionally, resonant circuit 205 includes a small capacitor coupled to an antenna (not shown in the block diagram) that provides tuning to a particular frequency. Resonant circuit 205 is coupled to the AGC controlled amplifier chain 230 through LNA 215. LNA 215 may also be part of the AGC controlled amplifier chain 230. LNA 215 and/or AGC amplifier chain 230 is controlled by the AGC driver 225.

Many AGC amplification systems are analog in nature in that they have an algorithm or a voltage protection system that evaluates the strength of an incoming or detected signal. If the incoming signal level is too strong, the AGC will adjust the received signal gain to maintain a constant gain level so as not to overdrive its amplifiers. In an embodiment, amplifiers 230 controlled by AGC driver 225 are configured as five amplifiers in series with each amplifier adjusted by AGC drive unit 225 and control section 245. In various embodiments, amplifiers 230 are configured as one or more amplifiers adapted in different arrangements. Amplifiers 230 are monitored by AGC detection circuit 235. AGC detection circuit 235 can be realized in numerous manners depending on the application, as can be appreciated by one skilled in the art, including using a diode or an op amp detection circuit for AM demodulation. Additionally there are a number of different methods to control the rate at which the AGC adjusts its gain and sensitivity.

In various embodiments, AGC driver 225 has its levels digitally controlled by control unit 220 and control section 245. The output of AGC driver 225 is set to a level where a detected signal is adjusted to a logic one and maintains optimum sensitivity for the detected signal. AGC driver 225 is set to maintain that gain in a communication session until a preset, or programmed, period of time that is correlated to a lost of signal in the communication session. This period of time acts as a kind of timeout. Embodiments providing this feature in a programmable digital manner in conjunction with AGC detector circuit 235 avoid the complexities associated with designing an analog component to perform a similar function.

Receiver 200 evaluates the quality and the type of signal received using control unit 220 that is responsive to information provided in the transmission protocol utilized with the received signal. In an embodiment in which a transmission protocol provides for effectively determining or predicting on/off periods in a communication session, control unit 220 can regulate AGC control section 245 such that AGC driver 225 maintains correct levels to enhance the reception by data detector 250. In an embodiment, control unit 220 determines a transmission protocol associated with a detected signal and uses preprogram AGC parameters correlated to pre-programmed on/off times for a given communication session according to the transmission protocol. In another embodiment, control unit 220 determines a transmission protocol associated with a detected signal and uses AGC parameters based on information provided in the detected signal according to the determined transmission protocol. Information provided by the detected signal may include, but is not limited to, scheduled on/off times and/or projected initial signal levels for the current communication session. The on/off times can be represented in various formats, such as beginning times for transmission and length of transmission in the communication session, or beginning times and ending times for transmissions in the communication session.

A received signal having appropriate gain is input to data detector 250 to provide the information being received. The output of data detector 250 is provided to a filter 255 followed by analog to digital data converter 260. In an embodiment, data detector 250 is an AM detector. Data detection can be performed digitally or through analog means. Data detector 250 may include detection using a diode. Filter 255 can be a digital or analog filter. Additionally, filter 255 can be a low pass filter. In an embodiment, filter 255 is a 30 KHz low pass filter. The feedback loop for AGC driver 225 goes through AGC control section 245, which provides interfacing of programming, or computer function, to AGC 225 which process the gain levels under the regulation from main control unit 220. A computer, electronic device, or system having computer functions can be in communication with control unit 220 to provide the programming of parameters used in managing AGC driver 225. In the embodiment depicted in FIG. 2, feedback is provided through main control unit 220 without feedback related to an AGC voltage.

In various embodiments using identified or known transmission protocols for a communication session, the gain levels for detection in AGC driver 225 can be pre-programmed with control, or regulation, parameters provided by control unit 220. In embodiments for receivers, such as receiver 200, gain levels do not require constant evaluation or continuous processing. Embodiments using programmable parameters based on a transmission protocol allow a gain level to be set for a programmed release time or until otherwise commanded. This avoids continually processing in a digital signal processor, DSP, information on signal strengths of the incoming signal for a current communication session to determine gain and/or sensitivity levels with respect to the incoming signal.

Figure 3:
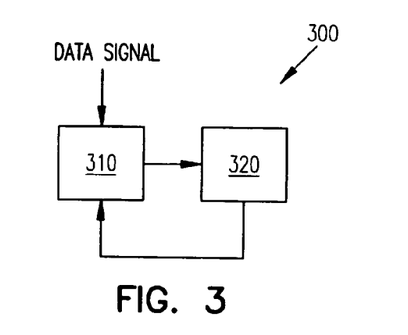
FIG. 3 shows a block diagram of an embodiment of a system using adaptive automatic gain control, in accordance with the teachings of the present invention.

FIG. 3 shows a block diagram of an embodiment of a system 300 using adaptive automatic gain control. System 300 includes a receiver 310 to receive wireless data signals and a processor 320 that is responsive to the data signals. The wireless signal may include signals using electrostatic fields, magnetic fields, or electromagnetic fields. In an embodiment, wireless signals are provided as RF signals. In various embodiments, receiver 310 can be realized in a configuration as described with respect to embodiments related to FIGS. 1, 2. Receiver 310 uses an adaptive AGC regulated by a control unit having programmable acquisition, hold, and release times based on one or more transmission protocols. These parameters can be provided by processor 320. In an embodiment, system 300 is adaptive to a handshake protocol that provides information to system 300 that a transmission in a communication session will be off for a specified period of time.

In an embodiment, system 300 having receiver 310 and processor 320 is a hearing aid. A hearing aid is a hearing assistance device that generally amplifies sound to compensate for poor hearing and is typically worn by a hearing impaired individual. In some instances, the hearing aid is a hearing assistance device that adjusts or modifies a frequency response to better match the frequency dependent hearing characteristics of a hearing impaired individual. A hearing aid can be a behind-the-ear (BTE) hearing aid, or an in-the-ear (ITE) hearing aid including a completely-in-the-canal (CIC) hearing aid. Other hearing assistance devices are possible without departing from the scope of the present system.

Figure 4:
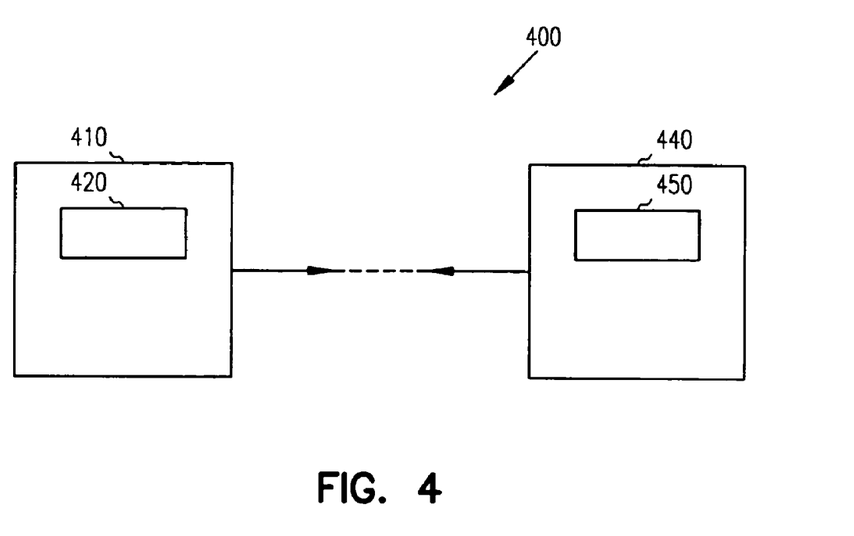
FIG. 4 shows a block diagram of another embodiment of a system using adaptive automatic gain control, in accordance with the teachings of the present invention.

FIG. 4 shows a block diagram of an embodiment of a system 400 using adaptive automatic gain control. System 400 includes a subsystem 410 having a transceiver 420 and a subsystem 440 having a transceiver 450, where subsystem 410 and subsystem 440 use wireless communication. In an embodiment, one or both transceivers 420, 450 can be realized in a configuration as described with respect to embodiments related to FIGS. 1, 2, and 3. In various embodiments, such transceivers use an adaptive AGC regulated by a control unit having programmable acquisition, hold, and release times based on one or more transmission protocols.

Controlling the AGC based on a transmission protocol allows gain and sensitivity to be set low for a wireless communication session within system 400 between subsystem 410 and subsystem 440 such that incoming signals from other sources at a low amplitude level are ignored, which can minimize communication collisions. In an embodiment, during periods of non-transmission between subsystem 410 and subsystem 440 in a communication session, the gain and/or sensitivity can be held at constant levels in transceivers 420, 450 in anticipation of the next transmission between subsystem 410 and subsystem 440. Controlling AGC levels in such a manner based on known protocols allows the operation of system 400 to be tailored to its environment.

In an embodiment, subsystem 410 and subsystem 440 have a relatively fixed position with respect to one other, i.e., movement with respect to each other is limited such that the path loss for a wireless signal between the two systems is relatively fixed. With a fixed path loss, the gain in subsystem 410 and in subsystem 440 can be adjusted to provide minimum signal-to-noise ratio (S/N), typically ranging from 16 to 18 db. Though a S/N of 18 db is typically not appropriate for audio applications, it does provide a minimum S/N level for data transmission. Thus, the gain for each of subsystems 410 and 440 can be reduced to provide an adequate S/N level for data transmission, minimizing power consumption and potential interference.

In an embodiment, subsystem 410 is a left ear hearing aid and subsystem 440 is a right ear hearing aid. Hearing aid 410 can communicate with hearing aid 440 providing information including, but not limited to, such information as its status as a left or right ear or its serial number based on factory preprogramming. In an embodiment, one hearing aid can act as a master and the other hearing aid as a slave in a master/slave configuration. In communication with an system external to system 400, such as a hearing aid programmer, the programmer can program both hearing aids in a communication with the master hearing aid, which in turn, provides the programming information to the slave hearing aid.

In an embodiment, subsystem 410 is a single hearing aid or the master hearing aid in a master/slave hearing aid arrangement, and subsystem 440 is a programming source. Programming source 440 may be a computer having hearing aid programs, a handheld hearing aid programmer, or a programmer that is worn in a fitting environment. In one embodiment, a programmer that is worn in a fitting environment is a type of neck loop. Then the distance between an antenna of the programming source 440 to an antenna of hearing aid 410 is relatively constant. In embodiment, in which programming source 440 is a handheld programmer, similar to a remote control, the distance between an antenna of the programming source 440 and an antenna of hearing aid 410 is relatively constant. Similarly, with a computer as the programming source 440 this distance can be held to be a relatively fixed short distance by remaining a short distance from the computer during a communication session.

Figure 5:
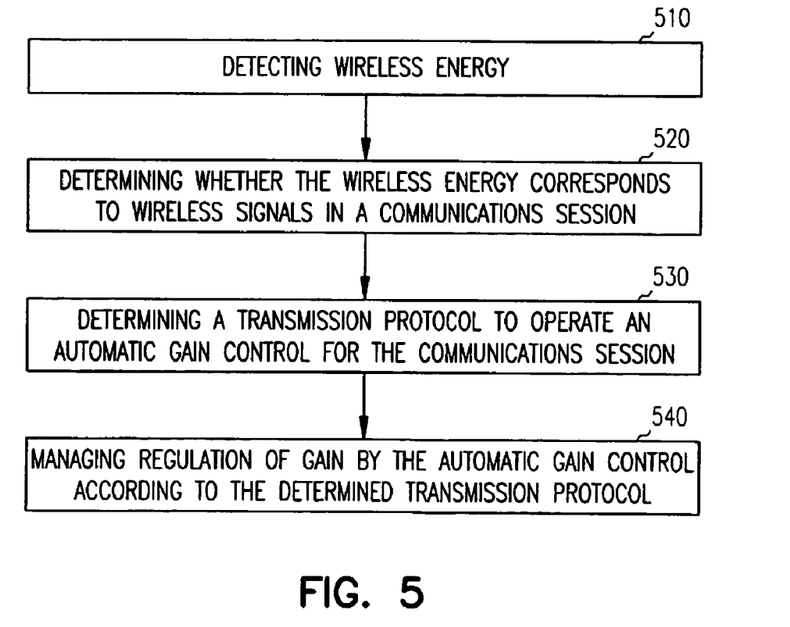
FIG. 5 shows a flow diagram of an embodiment for a method using adaptive automatic gain control, in accordance with the teachings of the present invention.

FIG. 5 shows a flow diagram of an embodiment for a method using adaptive automatic gain control. The depicted embodiment includes detecting wireless energy, at block 510, determining whether the detected wireless energy corresponds to wireless signals in a communication session, at block 520, determining a transmission protocol to operate an automatic gain control for the communication session, at block 530, and managing the automatic gain control to regulate gain according to the determined transmission protocol, at block 540. Wireless energy is energy from a medium used in wireless communication. The wireless signal may include signals using electrostatic fields, magnetic fields, or electromagnetic fields. In an embodiment, wireless signals are provided as RF signals. In an embodiment, information received in a detected wireless signal is used to program a control unit of a system with parameters for the automatic gain control of the system and with transmission information for one or more transmission protocols.

Figure 6:
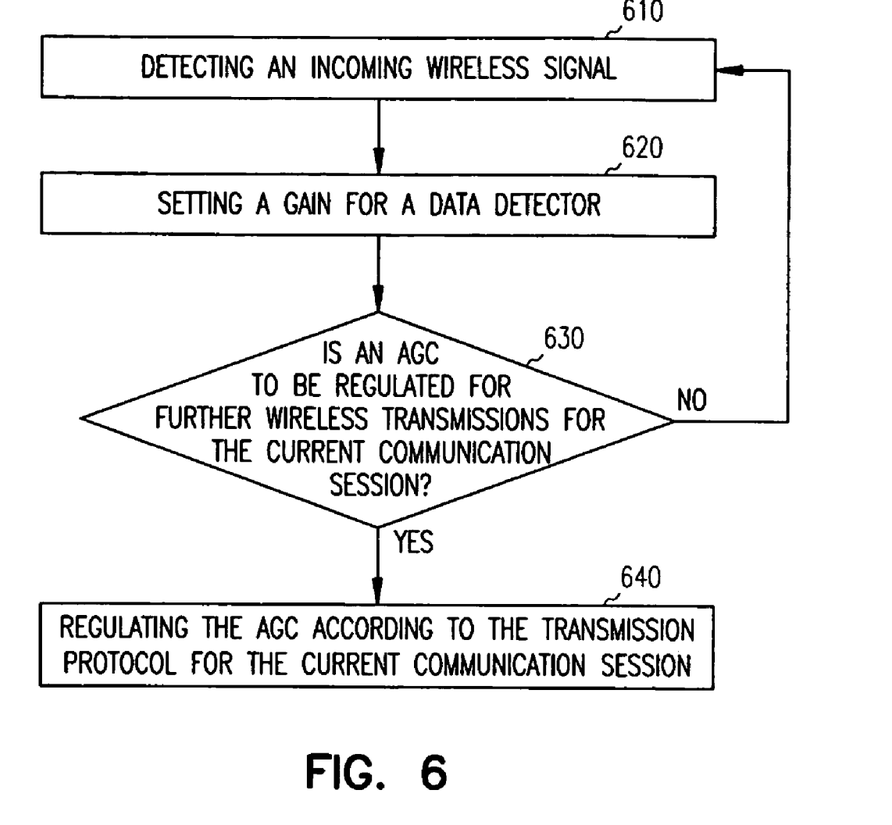
FIG. 6 illustrates a flow diagram for an embodiment of a method for managing regulation of gain by an automatic gain control according to a transmission protocol, in accordance with the teachings of the present invention.

FIG. 6 illustrates a flow diagram for an embodiment of a method for managing the regulation of gain by an automatic gain control according to a transmission protocol. This embodiment includes detecting an incoming signal, at block 610, setting a gain for a data detector, at block 620, determining whether the automatic gain control is to be regulated for further wireless transmissions in the same communication session or to be regulated to look for energy associated with a new communication session, at block 630, and regulating the automatic gain control according to a transmission protocol for the current communication session, at block 640. If the AGC is to be regulated to detect and lock-in on the wireless transmission from another communication session, the system adjusts to detect an incoming signal, at block 610, to continue tracking and processing wireless signals for managing communication sessions.

In an embodiment, an automatic gain control is regulated to reduce a gain level during a communication session during periods in a communication session in which signals are not being received. The periods in a communication session in which signals are not being received may be predetermined according to a transmission protocol. In an embodiment, periods in a communication session in which signals are not being received are specified by the incoming signal. Reducing the gain level during known periods of non-transmission in a communication session allows a system to avoid being triggered by random noise or other signals not part of the current communication session, as well as reducing power consumption. In an embodiment, the receiver section of the system can be turned off during the known periods for non-transmission in a communication session In an embodiment, during known periods of non-transmission in a communication session, the AGC is controlled to set gain levels to search for signals from one or more other known systems according to information programmed in the system including information regarding one or more transmission protocols. If a signal from another source is received, a handshake transmission procedure is conducted to identify the incoming signal. Once the incoming signal is identified as an appropriate signal with which to conduct a communication session, a scheduling of on and off times can be preformed. This scheduling procedure allows the system to have a communication session with the newly identified system and with the first system with which it is in a non-transmission mode of a communication session. With the AGC controlled by programmable patterns according to a transmission protocol, a system can use the digital protocol to adjust its performance relative to other systems. Thus, a system having an AGC controlled as described herein can wirelessly communicate within its subsystems and with multiple other systems and sources.

CONCLUSION

Embodiments for an automatic gain control that is regulated using programmable parameters in accordance with transmission protocols provides an enhanced method for receiving wireless signals. The wireless signal may include signals using electrostatic fields, magnetic fields, or electromagnetic fields. In an embodiment, wireless signals are provided as RF signals. The automatic gain control can quickly acquire new incoming wireless information. When a data transmission is compete in one portion of a communication session defined by a transmission protocol that provides control and transmission information, a control unit can issue a hold command to the automatic gain control to reduce or maintain sensitivity until signals are again transmitted in the next transmission portion of a communication session, minimizing interference from background noise and other unwanted signals and reducing power consumption. When a communication session is compete, the AGC can be released allowing increased sensitivity in preparation for the next transmission in a new communication session. Systems using transceivers with such ACG using a digital transmission protocol can efficiently adjust communication with a variety of other systems.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A receiver comprising:

a detector to acquire a wireless signal;

an automatic gain control to provide gain for the acquired wireless signal; and a control unit having programmable acquisition, hold, and release parameters to manage the acquisition and gain of the wireless signal based on a transmission protocol for a communication session with intermittent wireless transmissions, wherein the control unit is adapted to use the programmable acquisition parameter for use in attacking and locking onto an incoming signal, the programmable hold parameter for use in maintaining sensitivity for the incoming signal at a relatively constant level, and the programmable release parameter for use in increasing the sensitivity to detect a subsequent incoming signal, and wherein the control unit is adapted to use the programmable acquisition, hold, and release parameters for the transmission protocol to anticipate intermittent wireless transmissions in the communication session and manage the acquisition and gain accounting for the anticipated intermittent wireless transmissions.

2. The receiver of claim 1, wherein the control unit is programmed with a plurality of sets of acquisition, hold, and release parameters, each set related to a different transmission protocol.

3. The receiver of claim 1, wherein the control unit is programmed with a plurality of sets of acquisition, hold, and release parameters, each set related to a different transmitting unit.

4. The receiver of claim 1, wherein the wireless signal is a signal using an electrostatic field.

5. The receiver of claim 1, wherein the wireless signal is a signal using an magnetic field.

6. The receiver of claim 1, wherein the wireless signal is a signal using an electromagnetic field.

7. The receiver of claim 1, wherein the wireless signal is an RF signal.

8. The receiver of claim 1, wherein the control unit is adapted to regulate the automatic gain control to adjust a gain to a minimal level for detection of a wireless signal for a predetermined amount of time according to the transmission protocol.

9. The receiver of claim 1, wherein the control unit is adapted to issue a hold command to the automatic gain control to maintain sensitivity for a next wireless transmission in a communication session defined by a transmission protocol that provides control and transmission information.

10. The receiver of claim 9, wherein the hold command to the automatic gain control includes a length of time to maintain the sensitivity.

11. The receiver of claim 1, wherein the control unit is adapted to issue a hold command to the automatic gain control for a predetermined gain level to minimize the acquisition time for a wireless signal for a new communication session.

12. The receiver of claim 1, wherein the control unit is adapted to regulate the automatic gain control to increase a sensitivity when a communication session is ended.

13. The receiver of claim 1, wherein the control unit is adapted to regulate the automatic gain control to increase sensitivity when a wireless signal is not present during a period in a communication session in which the transmission protocol indicates a wireless transmission is scheduled.

14. A system comprising:
a receiver to receive wireless data signals; and
a processor responsive to the wireless data signals, wherein the receiver includes:
a detector to acquire a wireless signal;
an automatic gain control to provide gain for the acquired wireless signal; and
a control unit having programmable acquisition, hold, and release parameters to manage the acquisition and gain of the wireless signal based on a transmission protocol for a communication session with intermittent wireless transmissions,
wherein the control unit is adapted to use the programmable acquisition parameter for use in attacking and locking onto an incoming signal, the programmable hold parameter for use in maintaining sensitivity for the incoming signal at a relatively constant level, and the programmable release parameter for use in increasing the sensitivity to detect a subsequent incoming signal, and wherein the control unit is adapted to use the programmable acquisition, hold, and release parameters for the transmission protocol to anticipate intermittent wireless transmissions in the communication session and manage the acquisition and gain accounting for the anticipated intermittent wireless transmissions.

15. The system of claim 14, wherein the control unit is programmed with a plurality of sets of acquisition, hold, and release parameters, each set related to a different transmission protocol.

16. The system of claim 14, wherein the control unit is programmed with a plurality of sets of acquisition, hold, and release parameters, each set related to a different transmitting unit.

17. The receiver of claim 14, wherein the wireless signal is a signal using an electrostatic field.

18. The receiver of claim 14, wherein the wireless signal is a signal using an magnetic field.

19. The receiver of claim 14, wherein the wireless signal is a signal using an electromagnetic field.

20. The system of claim 14, wherein the wireless signal is an RF signal.

21. The system of claim 14, wherein the control unit regulates the automatic gain control to adjust a gain to a minimal level for detection of an wireless signal for a predetermined amount of time according the protocol.

22. The system of claim 14, wherein the control unit is adapted to issue a hold command to the automatic gain control to maintain sensitivity for a next wireless transmission in a communication session defined by a transmission protocol that provides control and transmission information.

23. The system of claim 14, wherein the control unit is adapted to issue a hold command for a predetermined gain level to minimize the acquisition time for a wireless signal in a next communication session.

24. The system of claim 14, wherein the control unit is adapted to increase a sensitivity when a communication session is ended.

25. The system of claim 14, wherein the control unit is adapted to increase a sensitivity when a wireless signal is not present at a time in communication session in which the transmission protocol indicates a scheduled wireless transmission.

26. The system of claim 14, wherein the control unit regulates the automatic gain control to adjust a gain to a minimal level to detect a wireless signal for a predetermined amount of time according to the transmission protocol to minimize unnecessary and unwanted amplification of electromagnetic interference during a data off portion of the wireless modulated transmission.

27. The system of claim 14, wherein the system is a hearing aid.

28. The system of claim 14, wherein the system further includes a transmitting subsystem.

29. The system of claim 28, wherein the transmitting subsystem is in a first hearing aid and the receiver is in a second hearing aid.

30. The system of claim 28, wherein the transmitting subsystem is in a first hearing aid programming unit, and the receiver is in a hearing aid.

31. A method comprising:
detecting wireless energy;

determining whether the detected wireless energy corresponds to a communication session with intermittent wireless transmissions;

determining a transmission protocol to operate an automatic gain control for the communication session; and managing the automatic gain control to regulate gain according to the determined transmission protocol, including using the determined transmission protocol to anticipate intermittent wireless transmissions in the communication session, and managing the automatic gain accounting for the anticipated intermittent wireless transmissions.

32. The method of claim 31, wherein determining a transmission protocol includes determining periods of time for gain levels associated with the communication session.

33. The method of claim 31, wherein detecting wireless energy includes detecting energy of an electrostatic field.

34. The method of claim 31, wherein detecting wireless energy includes detecting energy of a magnetic field.

35. The method of claim 31, wherein detecting wireless energy includes detecting energy of an electromagnetic field.

36. The method of claim 31, wherein detecting wireless energy includes detecting RF energy.

37. The method of claim 31, wherein managing the regulation of gain by the automatic gain control includes sending control signals to the automatic gain control to adjust a gain to a minimal level for detection of a wireless signal for a predetermined amount of time according the protocol.

38. The method of claim 31, wherein managing the regulation of gain by the automatic gain control includes sending a hold command to the automatic gain control to maintain sensitivity for a next wireless transmission in a communication session defined by a transmission protocol that uses intermittent information transmittal.

39. The method of claim 31, wherein managing the regulation of gain by the automatic gain control includes sending a hold command for a predetermined gain level to minimize the acquisition time for a wireless signal in a next communication session.

40. The method of claim 31, wherein managing the regulation of gain by the automatic gain control includes sending control signals to the automatic gain control to increase a sensitivity when a communication session is ended.

41. The method of claim 31, wherein managing the regulation of gain by the automatic gain control includes sending control signals to the automatic gain control to increase a sensitivity when a wireless signal is not present at a time in communication session in which the transmission protocol indicates a scheduled wireless transmission.

42. The method of claim 31, wherein the method further includes performing the method in a hearing aid.

43. The method of claim 31, further including transmitting a wireless signal.

44. The method of claim 31, wherein the method further includes transmitting a wireless signal from a hearing aid for a communication session with another hearing aid that receives the wireless signal.

45. The method of claim 31, wherein the method further includes transmitting a wireless signal from a hearing aid programming unit for a communication session with a hearing aid that receives the wireless signal.

* * * * *